(12) United States Patent
Kuroda

(10) Patent No.: US 8,005,119 B2
(45) Date of Patent: Aug. 23, 2011

(54) INTEGRATED CIRCUIT

(75) Inventor: Tadahiro Kuroda, Kanagawa (JP)

(73) Assignee: Keio University, Tokyo (JP)

( * ) Notice: Subject to any disclaimer, the term of this patent is extended or adjusted under 35 U.S.C. 154(b) by 75 days.

(21) Appl. No.: 12/320,463

(22) Filed: Jan. 27, 2009

(65) Prior Publication Data

US 2009/0196312 A1  Aug. 6, 2009

(30) Foreign Application Priority Data

Feb. 2, 2008  (JP) .................................. 2008-023397

(51) Int. Cl.
*H04J 3/06* (2006.01)
(52) U.S. Cl. ........................................ 370/503; 370/535
(58) Field of Classification Search .......... 370/200–253, 370/272–390, 431–546
See application file for complete search history.

(56) References Cited

U.S. PATENT DOCUMENTS

| | | | | |
|---|---|---|---|---|
| 4,245,650 | A | * | 1/1981 | Welker et al. ................. 600/508 |
| 5,559,441 | A | * | 9/1996 | Desroches ..................... 324/647 |
| 5,701,037 | A | | 12/1997 | Weber et al. |
| 2002/0016917 | A1 | * | 2/2002 | Kitamura ....................... 713/189 |
| 2006/0176624 | A1 | | 8/2006 | Kuroda et al. |
| 2006/0176676 | A1 | | 8/2006 | Kuroda et al. |
| 2007/0274198 | A1 | | 11/2007 | Kuroda et al. |
| 2007/0289772 | A1 | | 12/2007 | Kuroda et al. |
| 2008/0258744 | A1 | | 10/2008 | Kuroda et al. |
| 2009/0057039 | A1 | | 3/2009 | Kuroda et al. |

FOREIGN PATENT DOCUMENTS

| | | |
|---|---|---|
| JP | 2005-348264 A | 12/2005 |
| JP | 2006-50354 A | 2/2006 |
| JP | 2006-105630 A | 4/2006 |

OTHER PUBLICATIONS

Noriyuki et al IEEE, 2004.*
S. Kimura et al., "An On-Chip High Speed Serial Communication Method Based on Independent Ring Oscillators," In Proc. of International Solid-State Circuits Conference (ISSCC2003), pp. 390-391, Feb. 2003.
D. Mizoguchi et al., "A 1.2Gb/s/pin Wireless Superconnect based on Inductive Inter-chip Signaling (IIS)," IEEE International Solid-State Circuits Conference (ISSCC'04), Dig. Tech. Papers, pp. 142-143, 517, Feb. 2004.

(Continued)

*Primary Examiner* — Ricky Ngo
*Assistant Examiner* — Iqbal Zaidi
(74) *Attorney, Agent, or Firm* — Rader, Fishman & Grauer PLLC

(57) ABSTRACT

An integrated circuit multiplexes transmission data faster than by a system clock, and transfers a timing pulse Txclk for that multiplexing and a multiplexed signal Txdata from a transmitter chip 100 to a receiver chip 150 through communications by inductive coupling, respectively. Because of a transfer by inductive coupling being broadband, close-proximity wireless communications, the receiver chip 150 can faithfully obtain timing information on the timing pulse Txclk including jitter generated by a simple oscillator, and can thus accurately restore original data even by a high-speed transmission. This allows, in an integrated circuit that carries out communications by inductive coupling between chips to be stacked and mounted, carrying out communications between semiconductor chips with a small required area and faster than by a system clock.

5 Claims, 12 Drawing Sheets

OTHER PUBLICATIONS

N. Miura et al., "Analysis and Design of Transceiver Circuit and Inductor Layout for Inductive Inter-chip Wireless Superconnect," Symposium on VLSI Circuits; Dig. Tech. Papers, pp. 246-249, Jun. 2004.

N. Miura et al., "Cross Talk Countermeasures in Inductive Inter-Chip Wireless Superconnect," in Proc. IEEE Custom Integrated Circuits Conference (CICC'04), pp. 99-102, Oct. 2004.

N. Miura et al., "A 195Gb/s 1.2W 3D-Stacked Inductive Inter-Chip Wireless Superconnect with Transmit Power Control Scheme," IEEE International Solid-State Circuits-Conference (ISSCC'05), Dig. Tech. Papers, pp. 264-265, Feb. 2005.

N. Miura et al., "A 1Tb/s 3W Inductive-Coupling Transceiver for Inter-Chip Clock and Data Link," IEEE International Solid-State Circuits Conference (ISSCC'06), Dig. Tech. Papers, pp. 424-425, Feb. 2006.

N. Miura et al., "A 0.14pJ/b Inductive-Coupling Inter-Chip Data Transceiver with Digitally-Controlled Precise Pulse Shaping," IEEE International Solid-State Circuits Conference (ISSCC'07), Dig. Tech. Papers, pp. 358, 359 & 608, Feb. 2007.

* cited by examiner

RELATED ARTS

RELATED ARTS

RELATED ARTS

RELATED ARTS

RELATED ARTS

RELATED ARTS

RELATED ARTS

RELATED ARTS

RELATED ARTS

INTEGRATED CIRCUIT

BACKGROUND OF THE INVENTION

1. Field of the Invention

The present invention relates to an integrated circuit that is capable of suitably carrying out communications between chips such as IC (Integrated Circuit) bare chips to be stacked and mounted.

2. Description of the Related Arts

The present inventors have proposed electronic circuits that carry out communications by inductive coupling between chips to be stacked and mounted via coils formed by on-chip wiring of LSI (Large Scale Integration) chips (refer to Patent Literature 1).

FIG. 5 is a view depicting a configuration of a conventional (first) transmitter and receiver circuit. A part thereof is shown also in Patent Literature 1. FIG. 6 is a view depicting waveforms of respective portions of the circuit shown in FIG. 5. A transmitter circuit 300 is composed of a pulse generator 311, an inverter 312, a NOR circuit 313, transistors 314, 315, an inverter 316, a NOR circuit 317, transistors 318, 319, and a transmitter coil 320. The pulse generator 311 generates a pulse having a pulse width determined by a propagation delay of an inverter delay line in synchronization with a rising edge of a transmission clock Txclk. The pulse is input to an H-bridge circuit, and if a transmission signal Txdata is high at the rising edge of the transmission clock Txclk, the H-bridge circuit allows a positive (arrow direction in the figure) pulse current IT (if the transmission signal Txdata is low, a negative pulse current IT) to flow through the transmitter coil 320. With this construction, a positive or negative triangular wave current IT flows through the transmitter coil 320 according to the transmission signal Txdata at the rising edge of the transmission clock Txclk.

A receiver circuit 350 is composed of a receiver coil 340, resistors 321, 322, transistors 323 to 332, NAND circuits 333, 334, and inverters 335, 336, and forms a comparator with a latch in its entirety. The receiver circuit 350 receives a receiving clock (synchronization signal) Rxclk externally and outputs receiving data Rxdata. The transistors 323, 324 constitute a differential pair of a differential amplifier, and receive a signal VR from the receiver coil 340. The NAND circuits 333, 334 form a latch. The data received by the differential amplifier is sampled in synchronization with the receiving clock Rxclk to be input into the transistors 323 to 325, 329, and 331, and latched by the NAND circuits 333, 334, whereby the receiving signal Rxdata is restored.

This transmitter and receiver circuit is a synchronous type in which a system clock is used for reproduction of data. Accordingly, the data transfer rate is limited by the system clock.

Therefore, it has been proposed to synchronize high-speed data with timing pulses by independently having high-speed ring oscillators for generating timing pulses at the transmission side and the reception side, respectively, and sending signals to control the oscillation start/stop thereof parallel to transmitting data (refer to Non Patent Literature 1).

FIG. 7 is a view depicting a configuration of a conventional (second) transmitter and receiver circuit. FIG. 8 is a view depicting waveforms of respective portions of the circuit shown in FIG. 7. The transmission side is composed of a control circuit 411, an n-bit counter 412, a ring oscillator 413, a module (1) 414, and a $2^n$:1 multiplexer 415. The control circuit 411 operates based on an fHz system clock and supplies a reset pulse to the n-bit counter 412 (for example n=4). The n-bit counter 412 is reset by the reset pulse to make a timing signal Txstop as its MSB low, whereupon pulses are generated by the ring oscillator 413, and the n-bit counter 412 counts the pulses. The n-bit counter 412, when the n-bit counter 412 counts $2^{n-1}$ (for example 8) pulses, makes the timing signal Txstop high to stop pulse generation by the ring oscillator 413. The $2^n$:1 multiplexer 415 multiplexes $2^n$ (for example 16) parallel fb/s transmission data Mtxdata from the module (1) 414 $2^n$ times by rising and falling of a transmission timing pulse Txclk and transmits the multiplexed data as a $2^n$ fb/s serial transmission signal Txdata.

The timing signal Txstop is transmitted by a non-chip wiring 421 from the transmission side to the reception side, and the transmission signal Txdata, by an on-chip wiring 422.

The reception side is composed of a ring oscillator 431, a 1:$2^n$ demultiplexer 432, and a module (2) 433. The ring oscillator 431 receives a timing signal Rxstop corresponding to the timing signal Txstop to generate a receiving timing pulse Rxclk, and supplies the same to the 1:$2^n$ demultiplexer 432. The 1:$2^n$ demultiplexer 432 receives a receiving signal Rxdata corresponding to the transmission signal Txdata, demultiplexes the same to $2^n$ parallel fb/s receiving data Mrxdata by the receiving timing pulse Rxclk, and supplies the demultiplexed data to the module (2) 433.

However, while this technique is on the assumption that the respective ring oscillators have the same characteristics, in different chips, ring oscillators on the respective chips greatly differ in characteristics due to manufacturing variations despite being of the same design, the difference in chips results in a difference in power supply voltage, and it is thus difficult to match the timing of pulses to be generated by the ring oscillator in each chip, and this technique is not suitable for communications between chips.

FIG. 9 is a view depicting a configuration of a reference (third) transmitter and receiver circuit. This is an example where a transmitter chip 500 and a receiver chip are connected by wiring therebetween, and a multiplexed signal and a timing pulse of multiplication are respectively transmitted from the transmitter chip 500 to the receiver chip to perform demultiplexing in the receiver chip 550. The transmitter chip 500 is composed of a PLL (Phase Locked Loop) and a $2^n$:1 multiplexer 515. The PLL 510 is composed of a PFD (Phase Frequency Detector) 511, a CP (Charge Pump) 512, a VCO (Voltage Controlled Oscillator) 513, and a $\frac{1}{2}^{n-1}$ frequency divider 514, and generates a $2^{n-1}$ fHz transmission timing pulse Txclk from an fHz system clock and supplies the same to the $2^n$:1 multiplexer 515. The $2^n$:1 multiplexer 515 multiplexes $2^n$ parallel fb/s transmission data Mtxdata $2^n$ times by the transmission timing pulse Txclk and transmits the multiplexed data as a $2^n$fb/s serial transmission signal Txdata.

The transmission timing pulse Txclk is transmitted by an interchip wiring 521 from the transmitter chip 500 to the receiver chip 550, and the transmission signal Txdata, by an interchip wiring 522.

The receiver chip 550 is composed of a 1:$2^n$ demultiplexer 531, which receives a receiving timing pulse Rxclk corresponding to the transmission timing pulse Txclk, and demultiplexes a $2^n$fb/s serial receiving signal Rrxdata into $2^n$ parallel fb/s receiving data Mrxdata.

However, this method can be used for transmission of a continuous clock whose oscillation frequency has been controlled at high accuracy in the PLL, but is not suitable for transmission of a predetermined number of pulses generated by a ring oscillator etc.

FIG. 10A and FIG. 10B are views for comparing two types of pulse trains. FIG. 10A depicts a pulse train by a PLL, and FIG. 10B depicts a pulse train by a ring oscillator. As shown in FIG. 10A, a continuous clock ClkPLL generated in the PLL has been controlled in oscillation frequency with accuracy and thus has less jitter. On the other hand, a pulse train ClkRING of a predetermined number of pulses generated in the ring oscillator of a simpler configuration than the PLL is not stabilized in oscillation frequency, has a large amount of jitter, and contains a higher frequency component than that of the continuous clock ClkPLL. In the data transmission technology shown in FIG. 9, due to a band limitation of the interchip wiring, a high frequency component is cut in the course of transmission, so that the jitter of the pulse train ClkRING changes. Therefore, phase information of the pulse train ClkRING when being multiplexed is lost, erroneous phase information is transmitted to the 1:2" demultiplexer 531, so that demultiplexing cannot be correctly performed.

FIG. 11 is a view depicting a configuration of a conventional (fourth) transmitter and receiver circuit. A part thereof is shown also in Patent Literature 2. FIG. 12 is a view depicting waveforms of respective portions of the circuit shown in FIG. 11. A transmitter circuit 700 is composed of transistors 711 to 714, a delay line 715, and a transmitter coil 716. A receiver circuit 750 is composed of a receiver coil 721 and transistors 722 to 727.

This is an example where, when logic of a transmission signal Txdata transits, a positive or negative pulse current IT flows through the transmitter coil 716, and the receiver circuit 750 restores receiving data Rxdata, as a result of, by inverting data upon a latter-half pulse while ignoring a first-half pulse of a double pulse of a received voltage VR with using a change in threshold value due to latching of a hysteresis comparator. This enables asynchronous inductive coupling communication.

[Patent Literature 1] US 20070289772 A1
[Patent Literature 2] JP 2006-050354 A
[Non Patent Literature 1] S. Kimura et al., "An On-Chip High Speed Serial Communication Method Based on Independent Ring Oscillators," In Proc. of International Solid-State Circuits Conference (ISSCC2003), pp. 390-391, February 2003.

SUMMARY OF THE INVENTION

However, because the pulse of received voltage VR shown in FIG. 12 is a positive and negative double pulse to one logic transition of the transmission signal Txdata, the pulse width of the signal must be increased to secure time until generation of a next pulse, so that the transmission rate cannot be made faster.

In view of the above-described problems, it is therefore an object of the present invention to provide an integrated circuit capable of performing communications between semiconductor chips with a small required area and faster than by a system clock.

An integrated circuit according to a first aspect of the present invention comprises:
a transmitter chip including: a pulse generator for generating i (i is an integer i≧2) timing pulses for transmitting data from a system clock; a multiplexer for multiplexing transmission data to j:1 (j is an integer 2≦j≦2i) by the timing pulse; a first transmitter for transmitting by inductive coupling a multiplexed signal multiplexed by the multiplexer; a second transmitter for transmitting the timing pulse by inductive coupling; and
a receiver chip being stacked and mounted on the transmitter chip including: a first receiver for receiving the multiplexed signal by inductive coupling; a second receiver for receiving the timing pulse by inductive coupling; and a demultiplexer for demultiplexing the multiplexed signal to 1:j by the timing pulse.

Moreover, an integrated circuit according to a second aspect of the present invention further comprises a phase interpolator for generating an interpolation timing pulse of a 90 degrees phase to the timing pulse from the timing pulse, wherein the demultiplexer demultiplexes the multiplexed signal by the interpolation timing pulse.

Moreover, in an integrated circuit according to a third aspect of the present invention, the first transmitter comprises a transmitter coil for transmitting the multiplexed signal by inductive coupling, and enters a signal resulting from the multiplexed signal to one end of the transmitter coil and enters a signal resulting from a reverse polarity signal of the multiplexed signal to an other end of the transmitter coil to enter a waveform equivalent to a waveform of the multiplexed signal to the transmitter coil.

Moreover, in an integrated circuit according to a fourth aspect of the present invention, the first receiver comprises a receiver coil for receiving the multiplexed signal by inductive coupling, and forms a hysteresis circuit that repeats, first, inverting output when a voltage induced in the receiver coil exceeds a first threshold value, secondly, inverting output when a voltage induced in the receiver coil falls under a second threshold value smaller than the first threshold value, thirdly, inverting output when a voltage induced in the receiver coil exceeds the first threshold value, and so on.

Moreover, in an integrated circuit according to a fifth aspect of the present invention, the first receiver comprises a receiver coil for receiving the multiplexed signal by inductive coupling, and biases a center of the receiver coil toward a predetermined potential, and a circuit for generating a bias voltage is a circuit, having a same configuration as that of the first receiver, whose input and output are short-circuited or short-circuited through resistance.

According to the integrated circuit of the first aspect of the present invention, this generates a timing pulse faster than a system clock, multiplexes data by the timing pulse, and transmits the timing pulse from the transmitter chip to the receiver chip by inductive coupling, and thus it suffices to generate the timing pulse in the transmitter chip, and because of a transfer by inductive coupling being broadband, close-proximity wireless communications, the receiver chip can faithfully obtain timing information on the timing pulse including jitter generated by a simple oscillator, and can thus accurately restore original data even by a high-speed transmission, and moreover, an area on the chip necessary therefor can also be minimized.

According to the integrated circuit of the second aspect of the present invention, it is configured so that a rising edge or falling edge of the receiving timing pulse comes in the center of the data cycle of a receiving signal, so that the receiving data can be reliably latched.

According to the integrated circuit of the third aspect of the present invention, at the transition of the multiplexed signal, a positive or negative unipolar pulse can be induced in the receiver coil, and thus the pulse density can be increased by that much to increase the data transfer rate.

According to the integrated circuit of the fourth aspect of the present invention, a receiver tolerant of noise can be formed.

According to the integrated circuit of the fifth aspect of the present invention, a desired bias voltage can be adaptively generated even if the transistor characteristics, power supply voltage, and temperature have fluctuated.

DETAILED DESCRIPTION OF THE INVENTION

Hereinafter, a detailed description is given of a best mode for carrying out the present invention with reference to the accompanying drawings.

Figure 1:
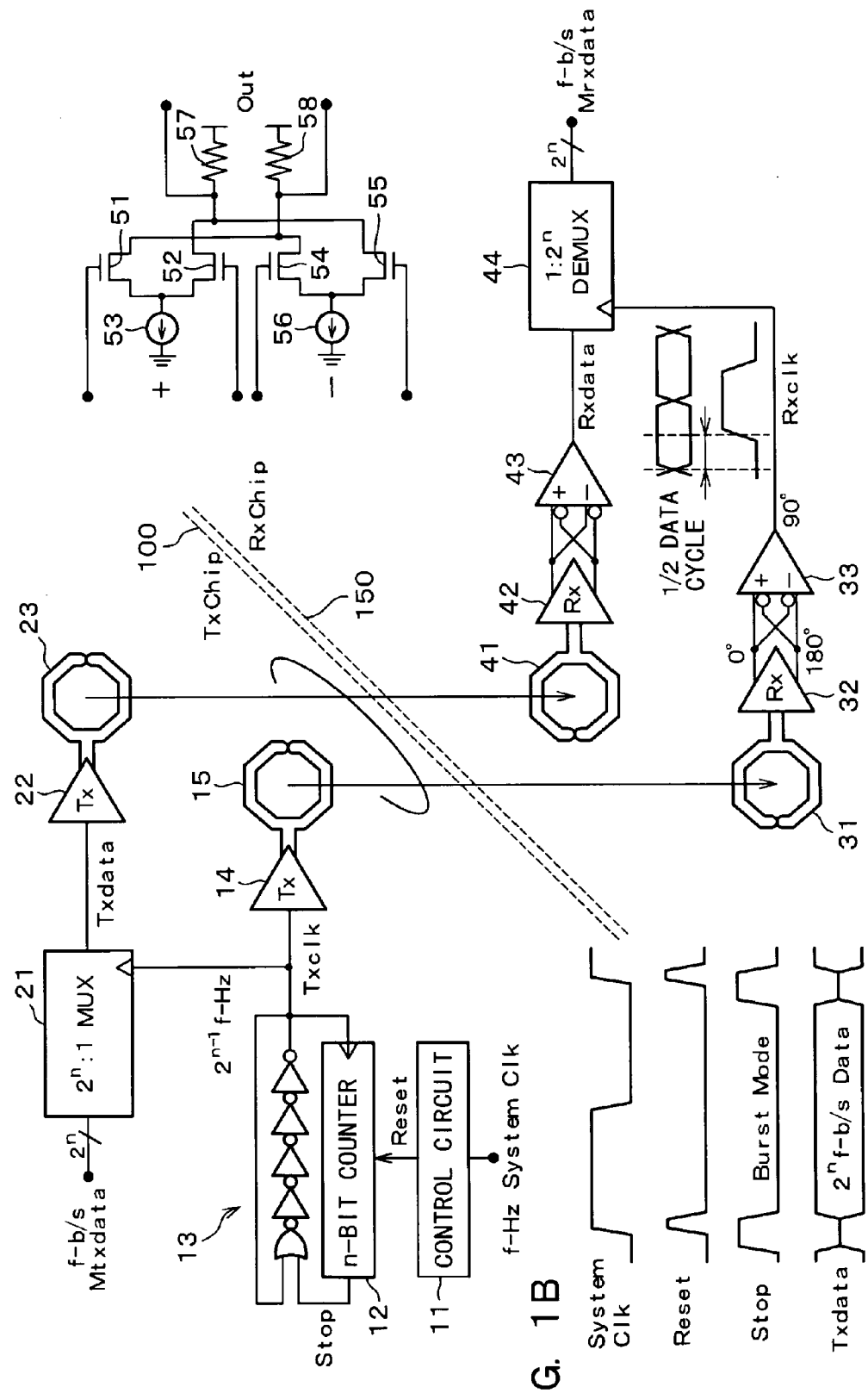
FIG. 1A, FIG. 1B, and FIG. 1C are views depicting a configuration of an integrated circuit according to one embodiment of the present invention.
Figure 7:
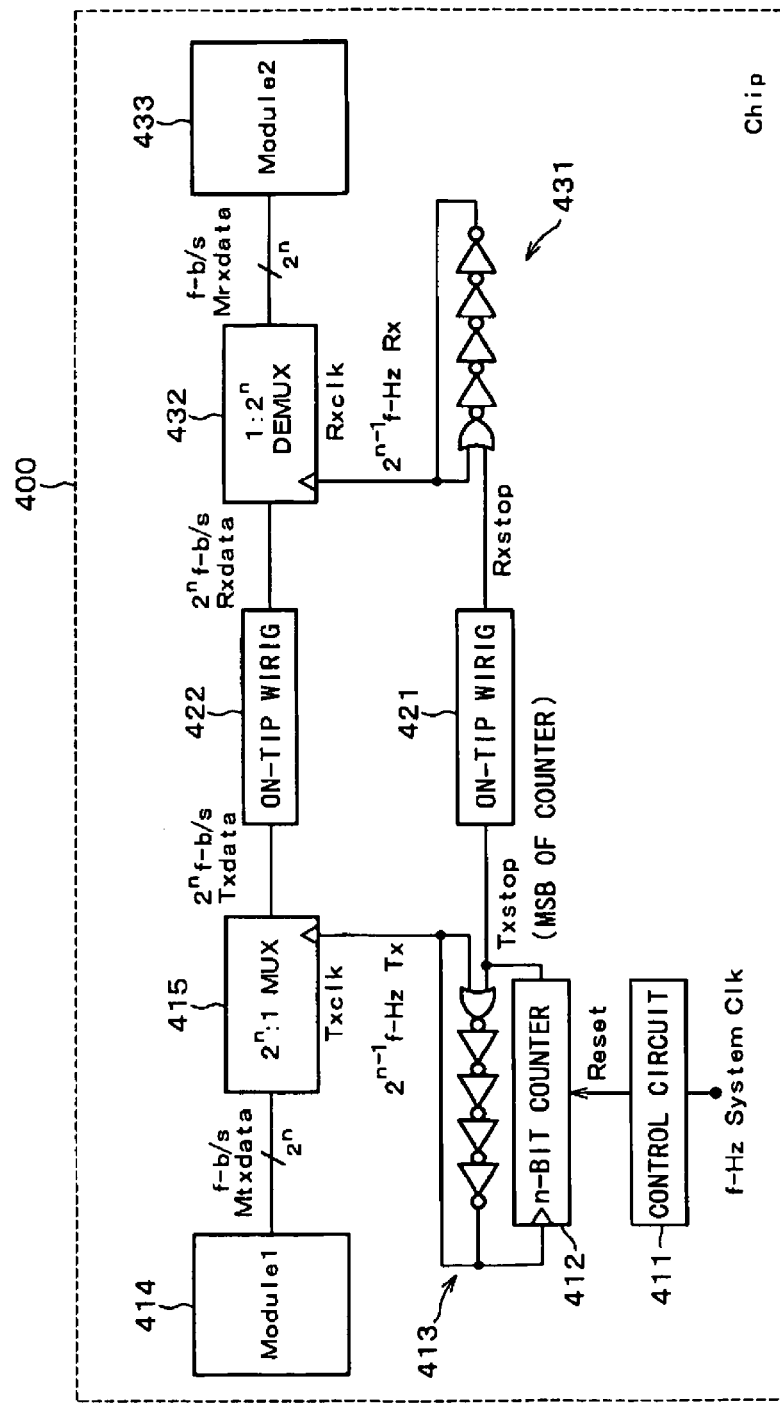
FIG. 7 is a view depicting a configuration of a conventional (second) transmitter and receiver circuit.
Figure 8:
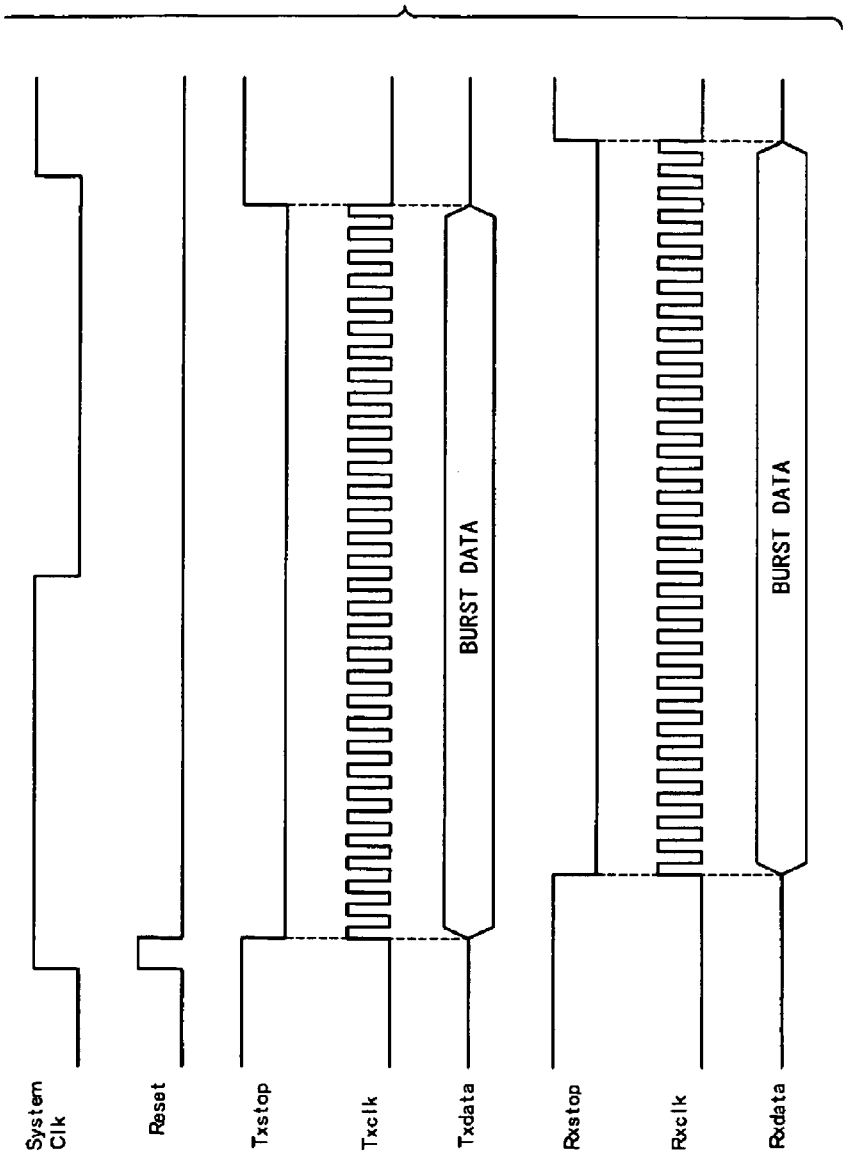
FIG. 8 is a view depicting waveforms of respective portions of the circuit shown in FIG. 7.
Figure 9:
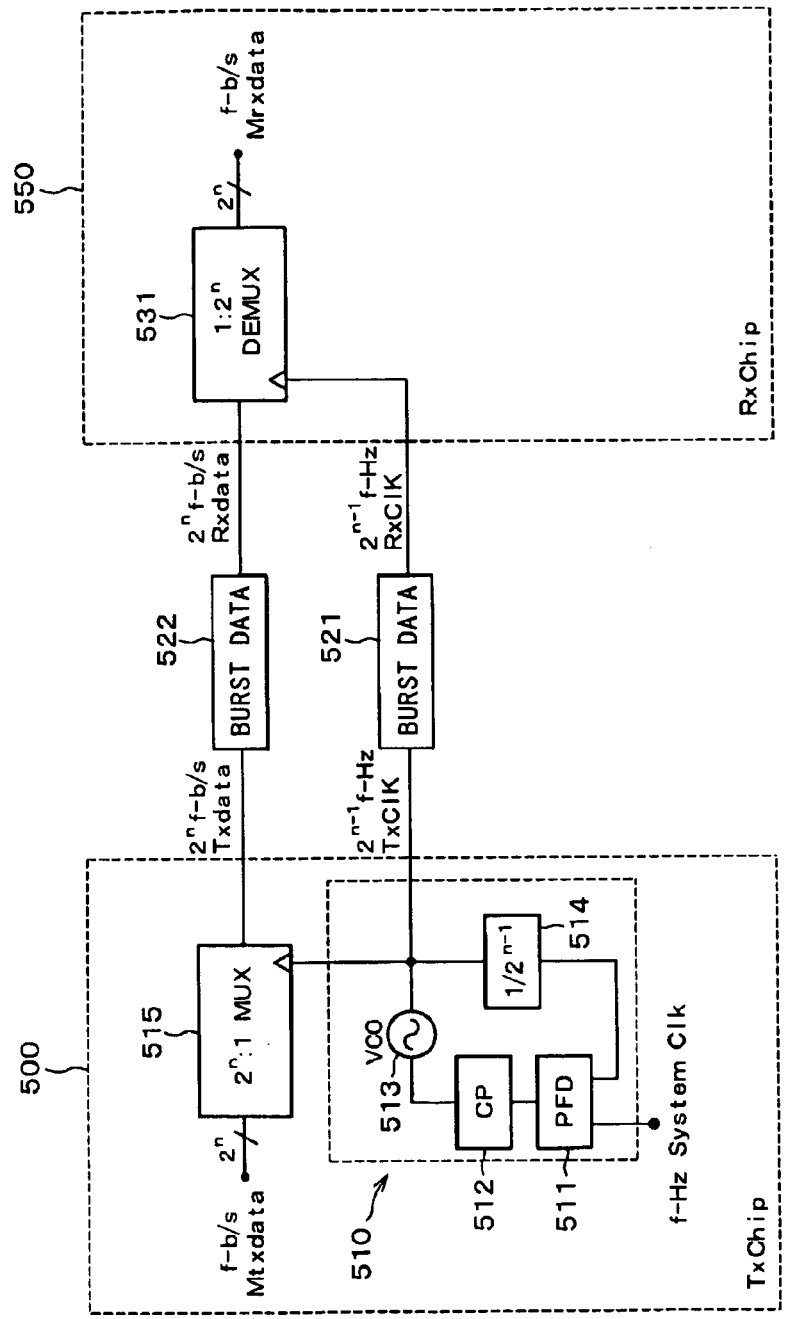
FIG. 9 is a view depicting a configuration of a reference (third) transmitter and receiver circuit.
Figure 10A:
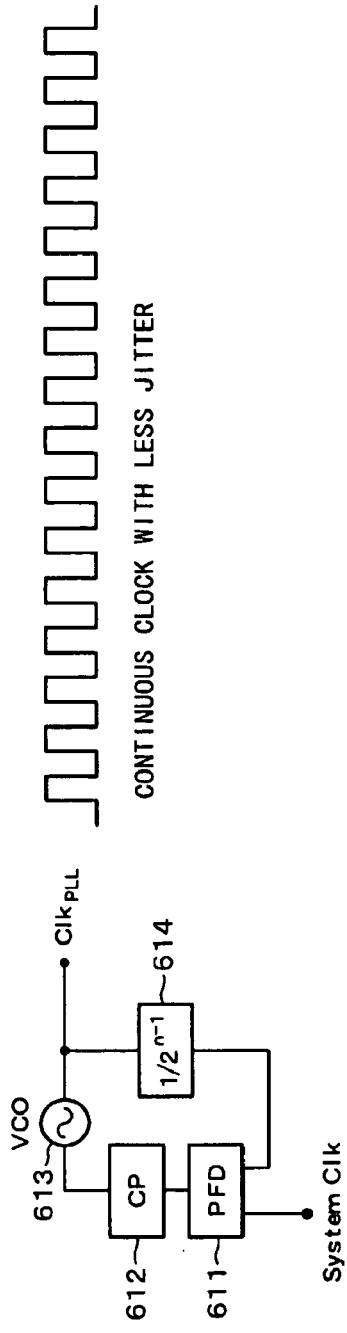
FIG. 10A and FIG. 10B are views for comparing two types of pulse trains.
Figure 10B:
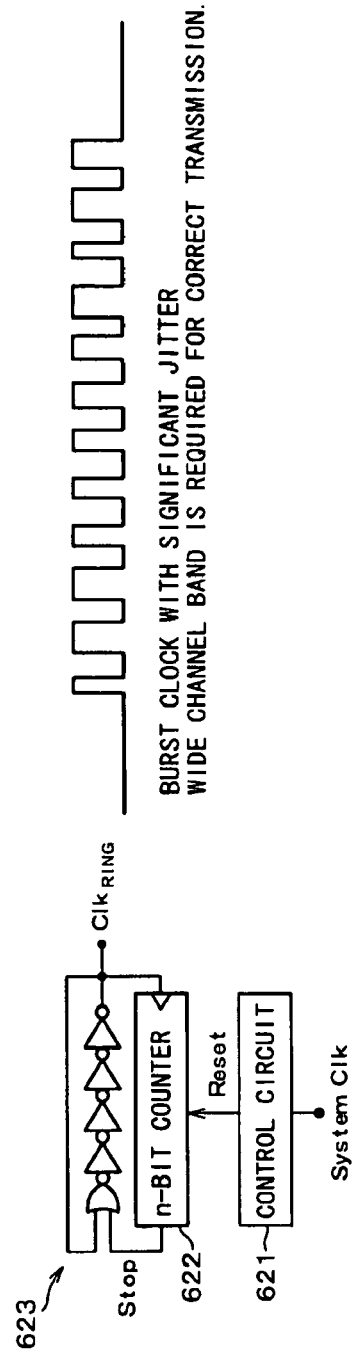
Figure 11:
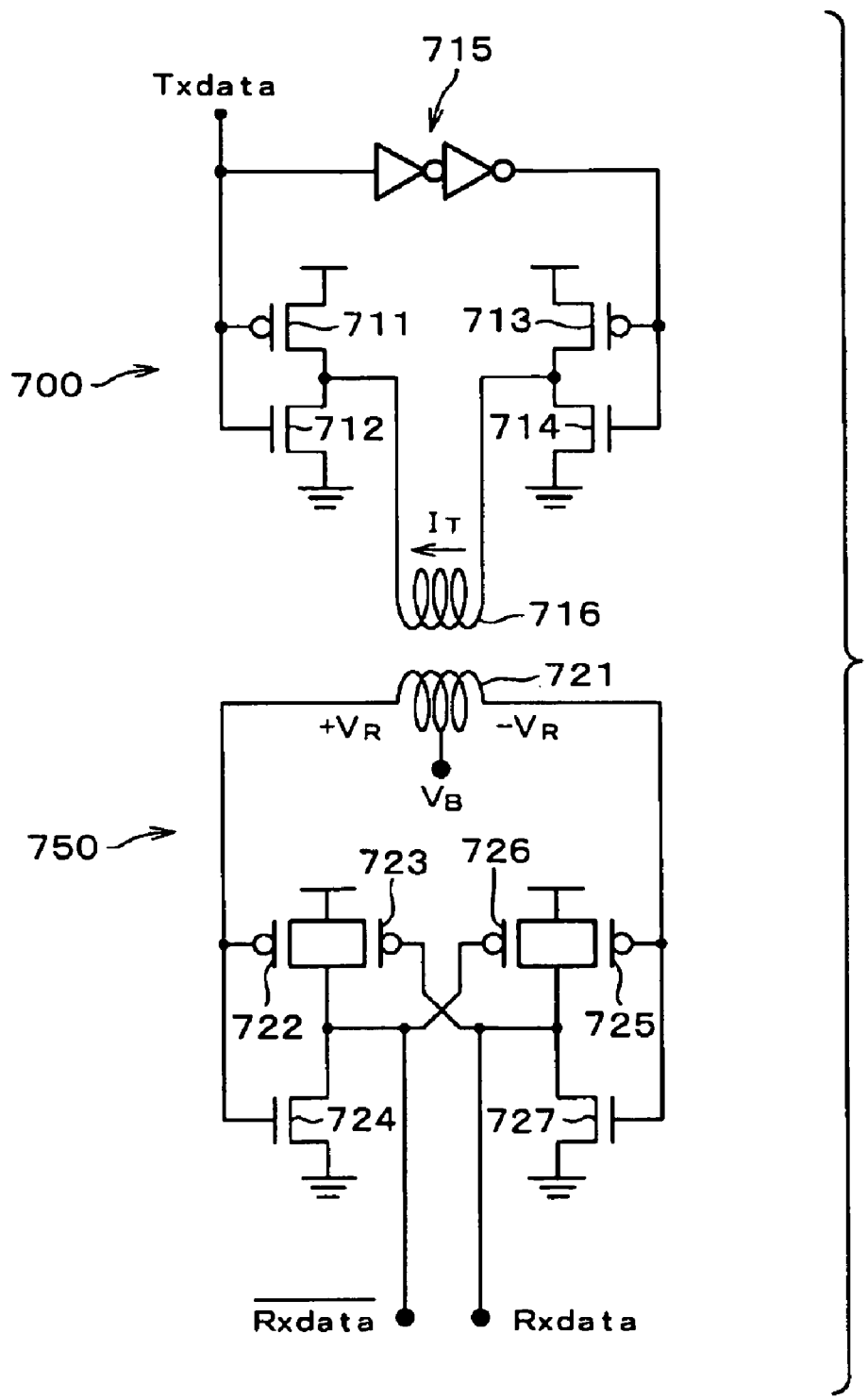
FIG. 11 is a view depicting a configuration of a conventional (fourth) transmitter and receiver circuit.
Figure 12:
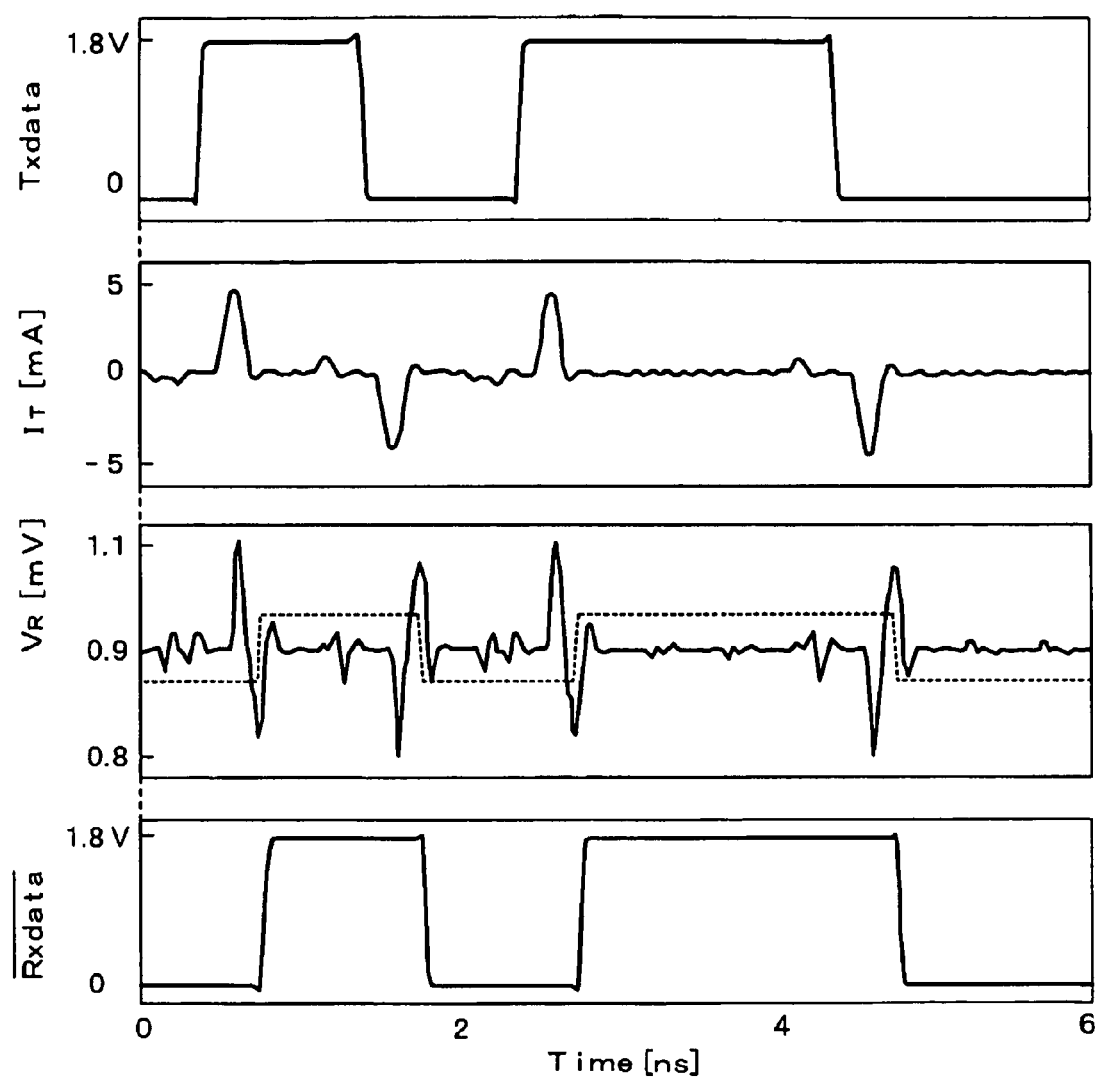
FIG. 12 is a view depicting waveforms of respective portions of the circuit shown in FIG. 11.

FIG. 1A, FIG. 1B, and FIG. 1C are views depicting a configuration of an integrated circuit according to one embodiment of the present invention. FIG. 1A depicts a configuration of the embodiment, FIG. 1B depicts waveforms of respective portions of the embodiment, and FIG. 1C depicts a configuration of a phase interpolator. A transmitter chip 100 is composed of a control circuit 11, an n-bit counter 12, a ring oscillator 13, a transmitter circuit 14, a transmitter coil 15, a $2^n$:1 multiplexer 21, a transmitter circuit 22, and a transmitter coil 23. An operation to generate a transmission timing pulse Txclk and an operation to demultiplex transmission data Mtxdata are the same as those shown in FIG. 7. In the present embodiment, the transmission timing pulse Txclk is transmitted to a receiver chip 150 by inductive coupling via the transmitter circuit 14 and the transmitter coil 15, and a transmission signal Txdata is transmitted to the receiver chip 150 by inductive coupling via the transmitter circuit 22 and the transmitter coil 23.

The receiver chip 150 is composed of a receiver coil 31, a receiver circuit 32, a phase interpolator 33, a receiver coil 41, a receiver circuit 42, a dummy phase interpolator 43, and a 1:$2^n$ demultiplexer 44. Although an operation of demultiplexing is the same as that shown in FIG. 7, in the present embodiment, a receiving timing pulse Rxclk corresponding to the transmission timing pulse Txclk is received via the receiver coil 31 and the receiver circuit 32, and the phase is shifted by 90 degrees in the phase interpolator 33 so that a rising edge or falling edge of the receiving timing pulse Rxclk comes in the center of the data cycle of a receiving signal Rxdata, thereby enabling reliably latching the receiving data Rxdata.

As shown in FIG. 1C, the phase interpolator 33 is composed of transistors 51, 52, 54, and 55, current sources 53, 56, and resistors 57, 58. These interpolate from two inputs of 0 degrees and 180 degrees to output a signal of 90 degrees being an intermediate phase therebetween. The dummy phase interpolator 43 cancels out a delay of the phase interpolator 33 itself, thereby always providing a phase difference of 90 degrees between the receiving signal Rxdata and the receiving timing pulse Rxclk.

Figure 2:
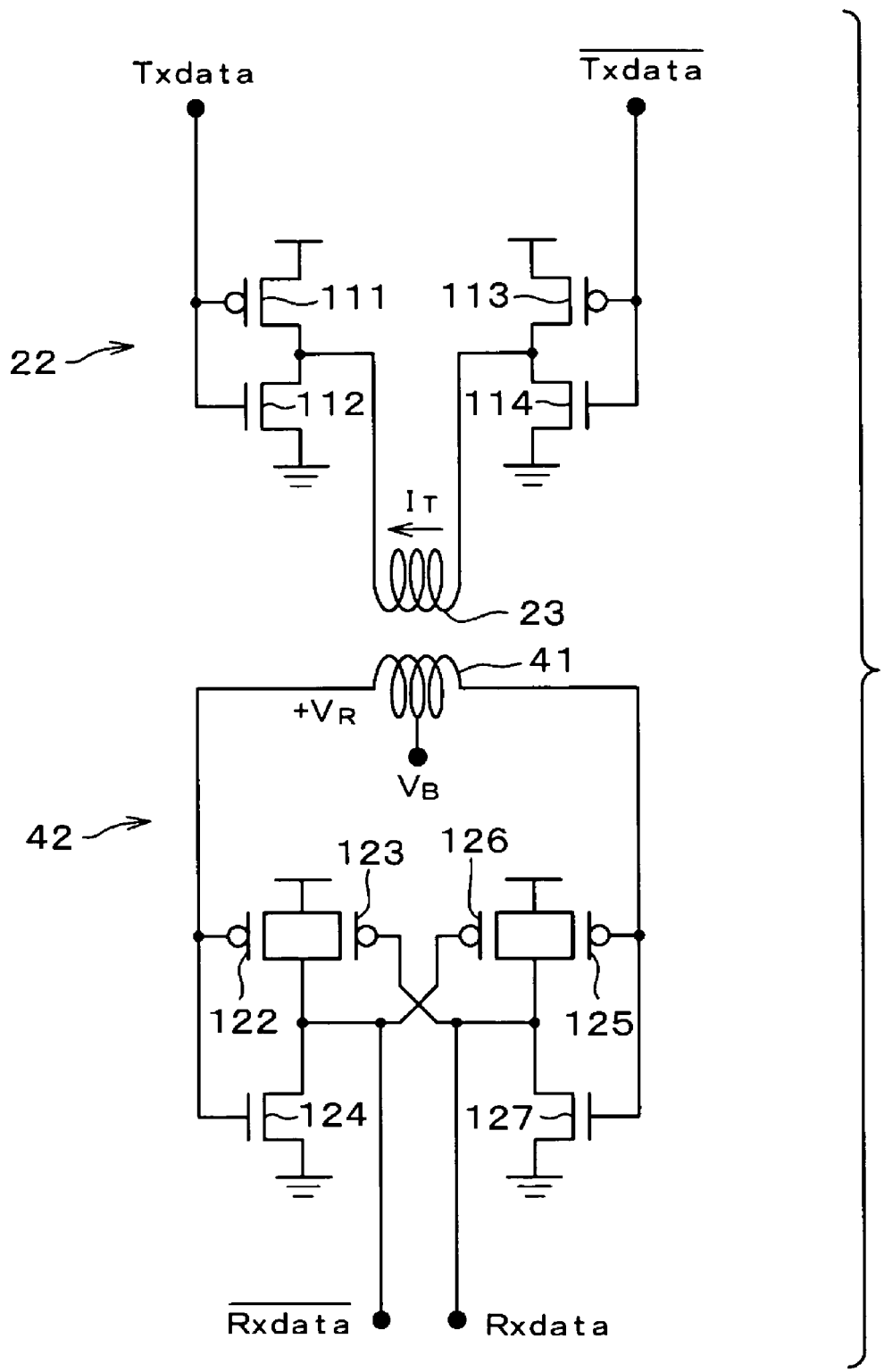
FIG. 2 is a view depicting a detailed configuration of a transmitter circuit and a receiver circuit of the present embodiment.
Figure 3:
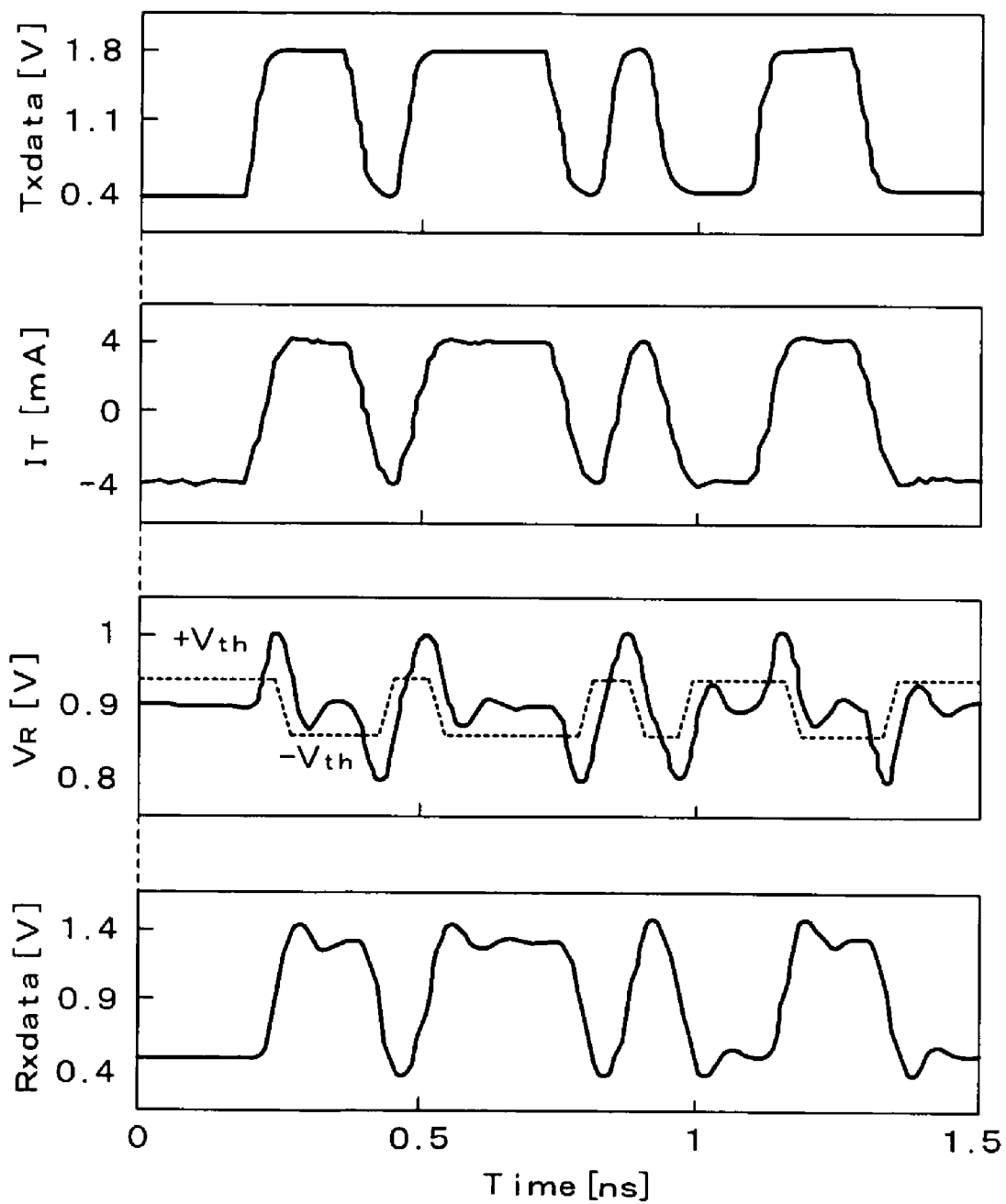
FIG. 3 is a view depicting waveforms of respective portions of the circuits shown in FIG. 2.

FIG. 2 is a view depicting a detailed configuration of a transmitter circuit and a receiver circuit of the present embodiment. FIG. 3 is a view depicting waveforms of respective portions of the circuits shown in FIG. 2. The transmitter circuit 22 is composed of transistors 111 to 114. These are directly driven by a transmission signal Txdata to allow a transmission current IT having the same waveform shape as that of the transmission signal Txdata to flow through the transmitter coil 23. Via an inductive coupling channel, positive and negative pulse voltages are generated in the receiver coil 41.

The receiver circuit 42 is composed of transistors 122 to 127. The receiver coil 41 has been biased to a voltage VB of about half the power supply voltage, and a positive pulse voltage with reference to this voltage is generated when the transmission signal Txdata changes from low to high, and when the transmission signal Txdata changes from high to low, a negative pulse voltage is generated.

The receiver circuit 42 forms a hysteresis comparator, which is composed of a gain circuit and a latch circuit. The gain circuit is inverters composed of 'a transistor 122 and a transistor 124' and 'a transistor 125 and a transistor 127', which connect both terminals of the receiver coil 41 to the gates to amplify a pulse voltage VR to be input. The receiving data Rxdata is inverted when the pulse voltage VR exceeds a certain threshold value. The latch circuit is cross-coupled PMOS transistors connected to the output of the inverters. This circuit has a function of holding the receiving signal Rxdata, thereby enabling correctly restoring digital data from the pulse voltage VR. This latch circuit changes the threshold value of an input inverter according to the holding data. A dotted line shown in the VR waveform of FIG. 3 indicates a change in threshold value of the inverter composed of the transistor 122 and the transistor 124. In the initial state, the latch circuit that holds a low receiving signal Rxdata raises the threshold value of the inverter by +Vth. The receiving signal Rxdata is inverted to be high when a positive pulse is input to the input and exceeds this threshold value. The latch circuit now reduces the threshold value of the inverter by −Vth, and holds the receiving signal Rxdata until a negative pulse voltage exceeding the threshold value is input next. Repeating this allows correctly restoring digital data from the positive and negative pulse voltages.

The transmitter and receiver circuit 22, 42 is an asynchronous type in which no clock is required for restoration of receiving data. It is not necessary to increase, as in the conventional synchronous type, the pulse width so as to keep a sampling margin. Accordingly, the data transfer rate is never limited by timing constraints as in the synchronous type.

Making the receiver circuit 42 operate at a high sensitivity enables receiving short-width pulses, thereby allowing increasing the data transfer rate.

The sensitivity of the receiver circuit 42 is determined by the input bias voltage VB. Adjusting the VB with accuracy to a point where the hysteresis comparator can operate at the highest sensitivity enables a high-speed operation.

Figure 4:
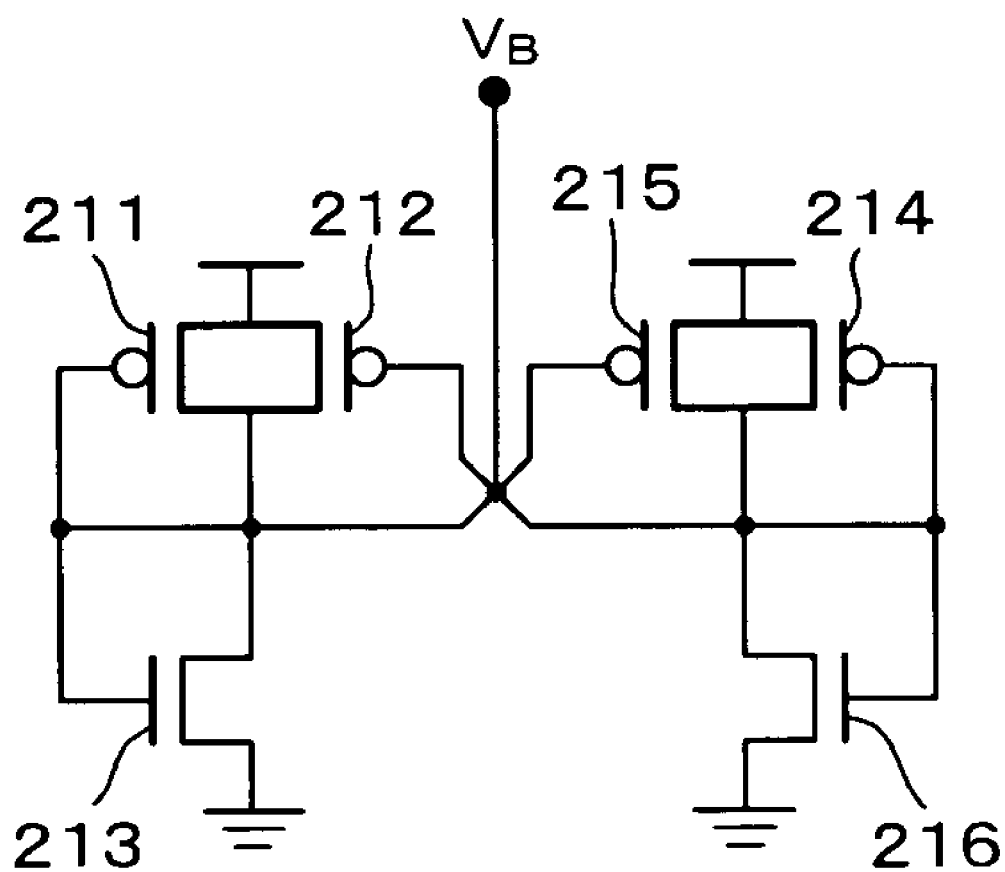
FIG. 4 is a view depicting a configuration of a bias generating circuit that generates an input bias voltage.
Figure 5:
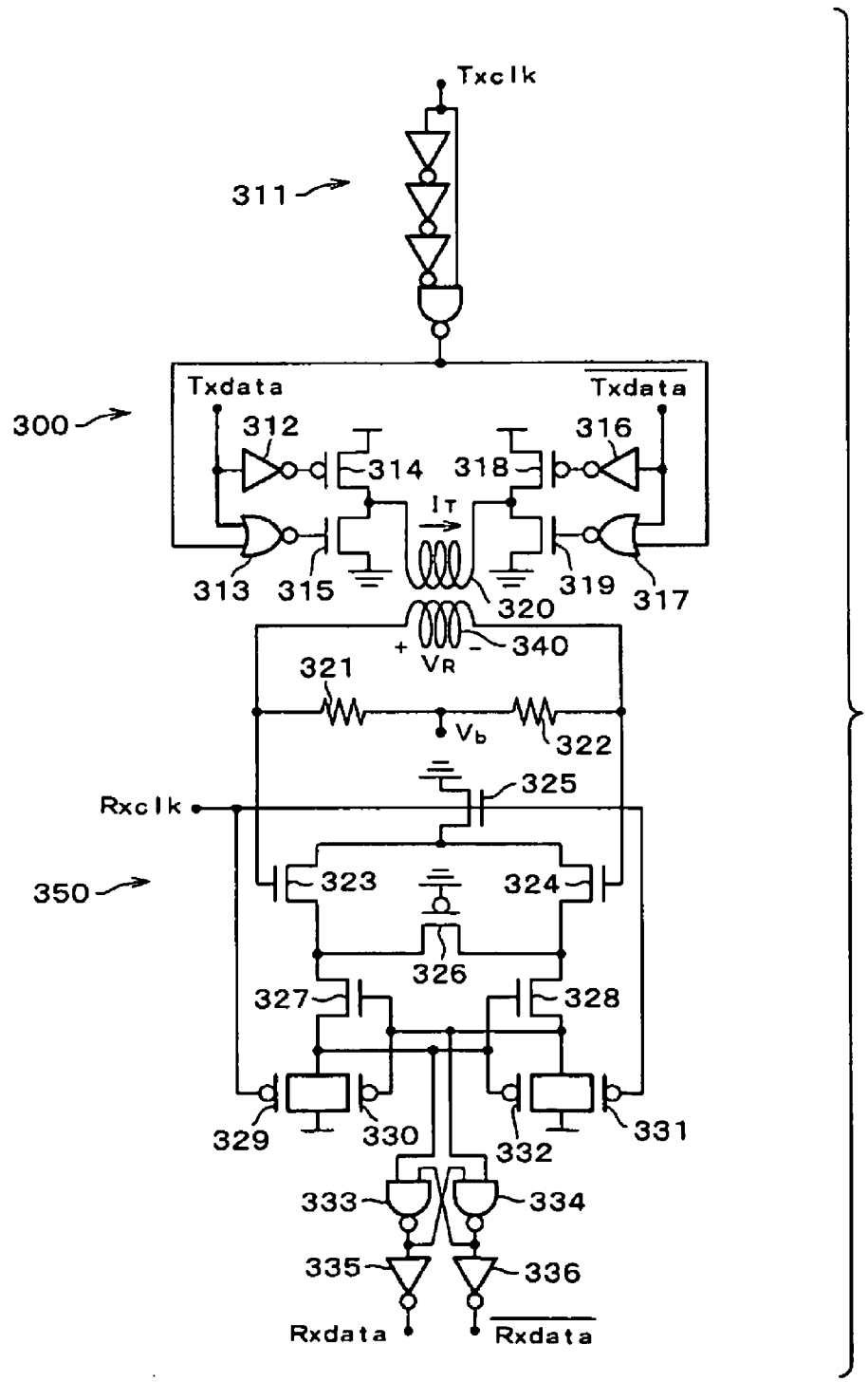
FIG. 5 is a view depicting a configuration of a conventional (first) transmitter and receiver circuit.
Figure 6:
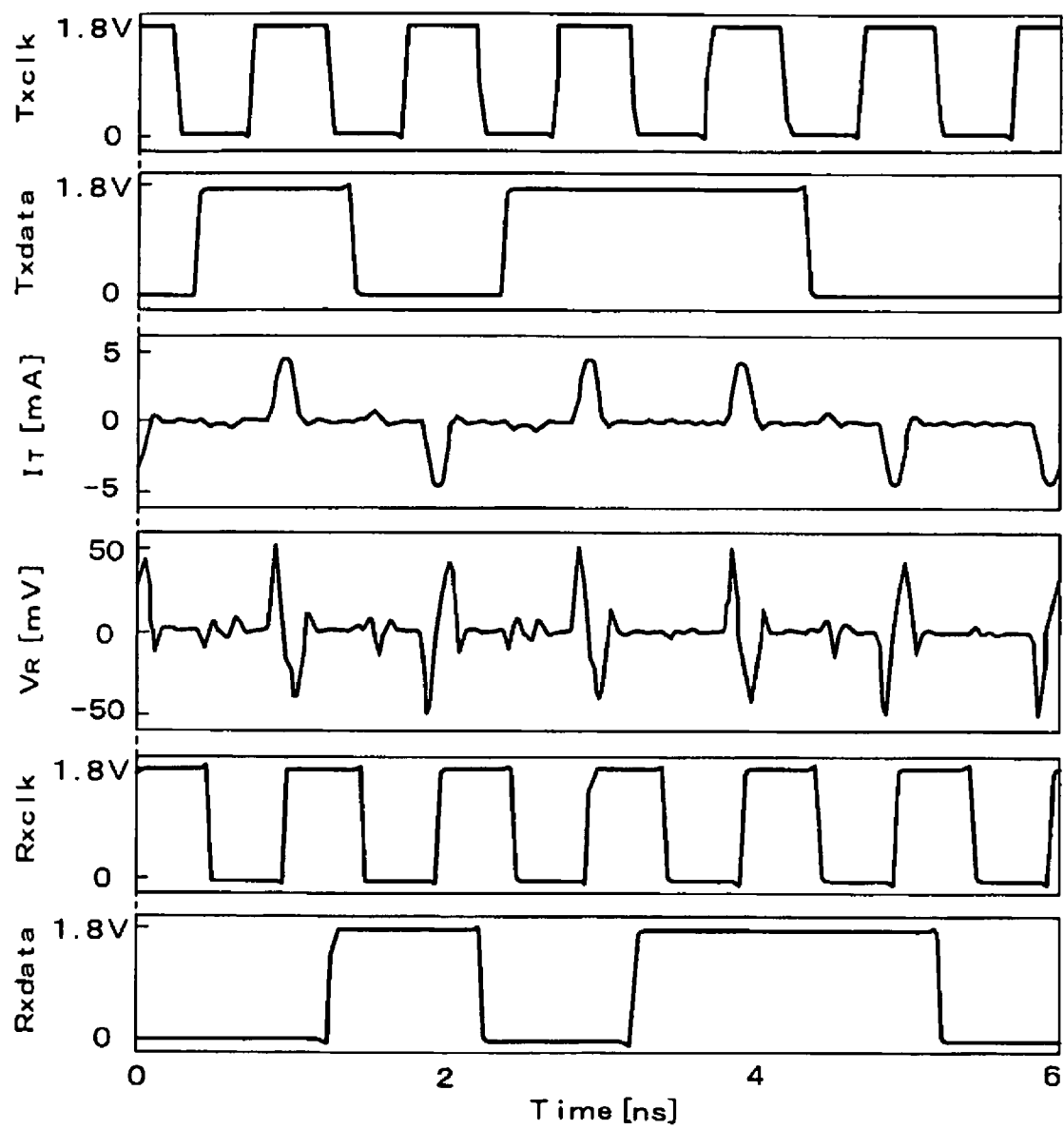
FIG. 6 is a view depicting waveforms of respective portions of the circuit shown in FIG. 5.

FIG. 4 is a view depicting a configuration of a bias generating circuit that generates an input bias voltage. The bias generating circuit, for which the input and output of a hysteresis comparator the same as that used for the receiver circuit 42 are short-circuited, and further, differential outputs are short-circuited, automatically generates a bias voltage to allow the hysteresis comparator to operate at the highest sensitivity. Moreover, the bias generating circuit is formed of a replica circuit that is exactly the same also in transistor size as the receiver circuit 42 body. This allows adaptively generating a desired bias voltage even if the transistor characteristics, power supply voltage, and temperature have fluctuated.

However, the present invention is not limited to the above-described embodiment.

In the embodiment of the present application, an example has been mentioned of multiplexing to a frequency of twice that of the timing pulses, however, the invention is not limited thereto. For example, those may be equalized, and even more timing pulses will not affect the implementation.

As the phase interpolator, an example that generates an interpolation timing pulse of a 90 degrees phase to the timing pulse has been mentioned, however, a latch timing pulse may be prepared by a delay, and the multiplexed signal may be delayed.

As the transmitter circuit, an example that supplies multiplexed signals of different polarities to both ends of the transmitter coil has been described, however, this may be configured such as to supply a multiplexed signal to one end of the transmitter coil and ground the other end via a capacitor.

As the receiver circuit, an example having hysteresis characteristics in the threshold value has been mentioned, however, this may be configured so as to detect a signal exceeding a first threshold value or below a second threshold value and ignore an intermediate signal therebetween.

As the bias circuit, an example using transistors having the same characteristics as those of the hysteresis circuit has been mentioned, however, when a high accuracy is not necessary such as when being used in a stable environment, this may be implemented even by a simple resistance circuit.

Although an example where the transmitter chip and the receiver chip are stacked and mounted has been mentioned, the invention is not limited thereto, and may be, for example, a configuration where each chip has a transmitter circuit and a receiver circuit.

The disclosure of Japanese Patent Application No. 2008-023397, filed on Feb. 2, 2008 including its specification, claims and drawings, is incorporated herein by reference in its entirety.

All the publications, patents and patent applications cited in the present specification are taken in the present specification as references.

What is claimed is:

1. An integrated circuit comprising:
   a transmitter chip including:
   a pulse generator for generating i (i is an integer $i \geqq 2$) timing pulses for transmitting data from a system clock;
   a multiplexer for multiplexing transmission data to j:1 (j is an integer $2 \leqq j \leqq 2i$) by said timing pulse;
   a first transmitter for transmitting by inductive coupling a multiplexed signal multiplexed by said multiplexer;
   a second transmitter for transmitting said timing pulse by inductive coupling; and
   a receiver chip being stacked and mounted on said transmitter chip including:
   a first receiver for receiving said multiplexed signal by inductive coupling;
   a second receiver for receiving said timing pulse by inductive coupling; and
   a demultiplexer for demultiplexing said multiplexed signal to 1:j by said timing pulse.

2. The integrated circuit according to claim 1, further comprising a phase interpolator for generating an interpolation timing pulse of a 90 degrees phase to said timing pulse from said timing pulse,
   wherein said demultiplexer demultiplexes said multiplexed signal by said interpolation timing pulse.

3. The integrated circuit according to claim 1, wherein said first transmitter comprises a transmitter coil for transmitting said multiplexed signal by inductive coupling, and enters a signal resulting from said multiplexed signal to one end of said transmitter coil and enters a signal resulting from a reverse polarity signal of said multiplexed signal to an other end of said transmitter coil to enter a waveform equivalent to a waveform of said multiplexed signal to said transmitter coil.

4. The integrated circuit according to claim 3, wherein said first receiver comprises a receiver coil for receiving said multiplexed signal by inductive coupling, and forms a hysteresis circuit that repeats, first, inverting output when a voltage induced in said receiver coil exceeds a first threshold value, secondly, inverting output when a voltage induced in said receiver coil falls under a second threshold value smaller than said first threshold value, thirdly, inverting output when a voltage induced in said receiver coil exceeds said first threshold value, and so on.

5. The integrated circuit according to claim 1, wherein said first receiver comprises a receiver coil for receiving said multiplexed signal by inductive coupling, and biases a center of said receiver coil toward a predetermined potential, and a circuit for generating a bias voltage is a circuit, having a same configuration as that of said first receiver, whose input and output are short-circuited or short-circuited through resistance.

\* \* \* \* \*